United States Patent
Uebel et al.

(10) Patent No.: US 11,754,906 B2
(45) Date of Patent: *Sep. 12, 2023

(54) HOLLOW-CORE PHOTONIC CRYSTAL FIBER BASED OPTICAL COMPONENT FOR BROADBAND RADIATION GENERATION

(71) Applicant: ASML Netherlands B.V., Veldhoven (NL)

(72) Inventors: Patrick Sebastian Uebel, Marloffstein (DE); Sebastian Thomas Bauerschmidt, Wendelstein (DE); Peter Maximilian Götz, Altdorf (DE)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 18/093,717

(22) Filed: Jan. 5, 2023

(65) Prior Publication Data

US 2023/0146877 A1 May 11, 2023

Related U.S. Application Data

(63) Continuation of application No. 17/485,836, filed on Sep. 27, 2021, now Pat. No. 11,556,044, which is a (Continued)

(30) Foreign Application Priority Data

Mar. 4, 2019 (EP) ..................... 19160457

(51) Int. Cl.
*G02F 1/35* (2006.01)
*G02F 1/365* (2006.01)

(52) U.S. Cl.
CPC ............ *G02F 1/353* (2013.01); *G02F 1/3501* (2013.01); *G02F 1/365* (2013.01); *G02F 1/3503* (2021.01); *G02F 1/3528* (2021.01)

(58) Field of Classification Search
CPC .... G02F 1/3501; G02F 1/3503; G02F 1/3528; G02F 1/353; G02F 1/365; G02F 2001/3503

See application file for complete search history.

(56) References Cited

U.S. PATENT DOCUMENTS

| | | | |
|---|---|---|---|
| 6,952,253 | B2 | 10/2005 | Lof et al. |
| 6,961,116 | B2 | 11/2005 | Den Boef et al. |
| (Continued) | | | |

FOREIGN PATENT DOCUMENTS

| | | |
|---|---|---|
| CN | 104184042 A | 12/2014 |
| CN | 104577683 A | 4/2015 |
| (Continued) | | |

OTHER PUBLICATIONS

International Search Report and Written Opinion of the International Searching Authority directed to related International Patent Application No. PCT/EP2020/053999, dated Mar. 11, 2020; 15 pages.
(Continued)

*Primary Examiner* — Daniel Petkovsek
(74) *Attorney, Agent, or Firm* — Sterne, Kessler, Goldstein & Fox P.L.L.C.

(57) ABSTRACT

Disclosed is an optical component, being configured to function as an optical frequency converter in a broadband radiation source device. The optical component comprises a gas cell, and a hollow-core photonic crystal fiber at least partially enclosed within said gas cell. The local cavity volume of said gas cell, where said hollow-core photonic crystal fiber is enclosed within the gas cell, comprises a maximum value of 36 $cm^3$ per cm of length of said hollow-core photonic crystal fiber.

20 Claims, 6 Drawing Sheets

Related U.S. Application Data continuation of application No. 16/808,141, filed on Mar. 3, 2020, now Pat. No. 11,163,208.

(56) References Cited

U.S. PATENT DOCUMENTS

| | | | |
|---|---|---|---|
| 7,265,364 | B2 | 9/2007 | Teunissen et al. |
| 7,391,561 | B2 | 6/2008 | Di Teodoro et al. |
| 7,400,804 | B1 | 7/2008 | Di Teodoro et al. |
| 7,646,471 | B2 | 1/2010 | Teunissen et al. |
| 7,701,577 | B2 | 4/2010 | Straaijer et al. |
| 7,791,724 | B2 | 9/2010 | Den Boef et al. |
| 8,079,763 | B2 | 12/2011 | Benabid |
| 8,115,926 | B2 | 2/2012 | Straaijer |
| 8,553,227 | B2 | 10/2013 | Jordanoska |
| 8,681,312 | B2 | 3/2014 | Straaijer |
| 8,692,994 | B2 | 4/2014 | Straaijer |
| 8,792,096 | B2 | 7/2014 | Straaijer |
| 8,797,554 | B2 | 8/2014 | Straaijer |
| 8,823,922 | B2 | 9/2014 | Den Boef |
| 9,160,137 | B1 | 10/2015 | Abdolvand et al. |
| 10,288,558 | B2 | 5/2019 | Das |
| 10,693,271 | B2 | 6/2020 | Uebel et al. |
| 11,163,208 | B2 * | 11/2021 | Uebel ............... G03F 9/7065 |
| 11,556,044 | B2 * | 1/2023 | Uebel ............... G03F 9/7065 |
| 2010/0233600 | A1 | 9/2010 | Den Boef et al. |
| 2010/0328655 | A1 | 12/2010 | Den Boef |
| 2011/0026032 | A1 | 2/2011 | Den Boef et al. |
| 2011/0102753 | A1 | 5/2011 | Van De Kerkhof et al. |
| 2011/0249244 | A1 | 10/2011 | Leewis et al. |
| 2012/0044470 | A1 | 2/2012 | Smilde et al. |
| 2013/0162996 | A1 | 6/2013 | Straaijer et al. |
| 2013/0202006 | A1 | 8/2013 | Rudolph et al. |
| 2014/0334763 | A1 | 11/2014 | Holzer et al. |
| 2015/0261097 | A1 | 9/2015 | Mathijssen et al. |
| 2016/0161863 | A1 | 6/2016 | Den Boef et al. |
| 2016/0370717 | A1 | 12/2016 | Den Boef et al. |
| 2017/0108641 | A1 | 4/2017 | Cai et al. |
| 2018/0275048 | A1 * | 9/2018 | Das ............... G01N 21/3504 |
| 2019/0319420 | A1 | 10/2019 | Uebel et al. |
| 2020/0166699 | A1 | 5/2020 | Bauerschmidt et al. |
| 2020/0285129 | A1 | 9/2020 | Uebel et al. |
| 2020/0310251 | A1 | 10/2020 | Uebel et al. |
| 2022/0011644 | A1 | 1/2022 | Uebel et al. |

FOREIGN PATENT DOCUMENTS

| | | |
|---|---|---|
| CN | 106768859 A | 5/2017 |
| EP | 1 628 164 A2 | 2/2006 |
| EP | 3 136 143 A1 | 3/2017 |
| WO | WO 2016/102127 A1 | 6/2016 |
| WO | WO 2018/127266 A1 | 7/2018 |

OTHER PUBLICATIONS

Benabid et al., "Low insertion-loss (1.8 dB) and vacuum-pressure all-fiber gas cell based on Hollow-Core PCF," European Conference on Lasers and Electro-Optics and the International Quantum Electronics Conference, Jun. 1, 2007; 1 page.

Gladyshev et al., "2.9, 3.3, and 3.5 um Raman Lasers Based on Revolver Hollow-Core Silica Fiber Filled by 1H2/D2 Gas Mixture," IEEE Journal of Selected Topics in Quantum Electronics, Feb. 28, 2018; 8 pages.

International Preliminary Report on Patentability directed to International Patent Application No. PCT/EP2020/053999, dated Aug. 25, 2021; 7 pages.

* cited by examiner

HOLLOW-CORE PHOTONIC CRYSTAL FIBER BASED OPTICAL COMPONENT FOR BROADBAND RADIATION GENERATION

CROSS REFERENCE TO RELATED APPLICATIONS

This application is a continuation application of U.S. patent application Ser. No. 17/485,836, filed Sep. 27, 2021, now U.S. Pat. No. 11,556,044, Issued Jan. 17, 2023, which is a continuation application of U.S. patent application Ser. No. 16/808,141, filed Mar. 3, 2020, now U.S. Pat. No. 11,163,208, Issued Nov. 2, 2021, which claims priority to European Patent Application No. 19160457.8, filed Mar. 4, 2019, which are hereby incorporated herein in their entireties by reference.

FIELD

The present invention relates to a hollow-core photonic crystal fiber based broadband radiation generator, and in particular such a broadband radiation generator in relation to metrology applications in in the manufacture of integrated circuits.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda/NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

Metrology tools are used in many aspects of the IC manufacturing process, for example as alignment tools for proper positioning of a substrate prior to an exposure, leveling tools to measure a surface topology of the substrate, for e.g., focus control and scatterometry based tools for inspecting/measuring the exposed and/or etched product in process control. In each case, a radiation source is required. For various reasons, including measurement robustness and accuracy, broadband or white light radiation sources are increasingly used for such metrology applications. It would be desirable to improve on present devices for broadband radiation generation.

SUMMARY

In a first aspect of the invention, there is provided an optical component, being configured to function as an optical frequency converter in a broadband radiation source device, comprising: a gas cell, and a hollow-core photonic crystal fiber at least partially enclosed within said gas cell; wherein, where said hollow-core photonic crystal fiber is enclosed within said gas cell, and the local cavity volume of said gas cell comprises a maximum value of 36 cm$^3$ per cm of length of said hollow-core photonic crystal fiber.

Other aspects of the invention comprise a broadband radiation source and metrology device comprising the optical component of the first aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
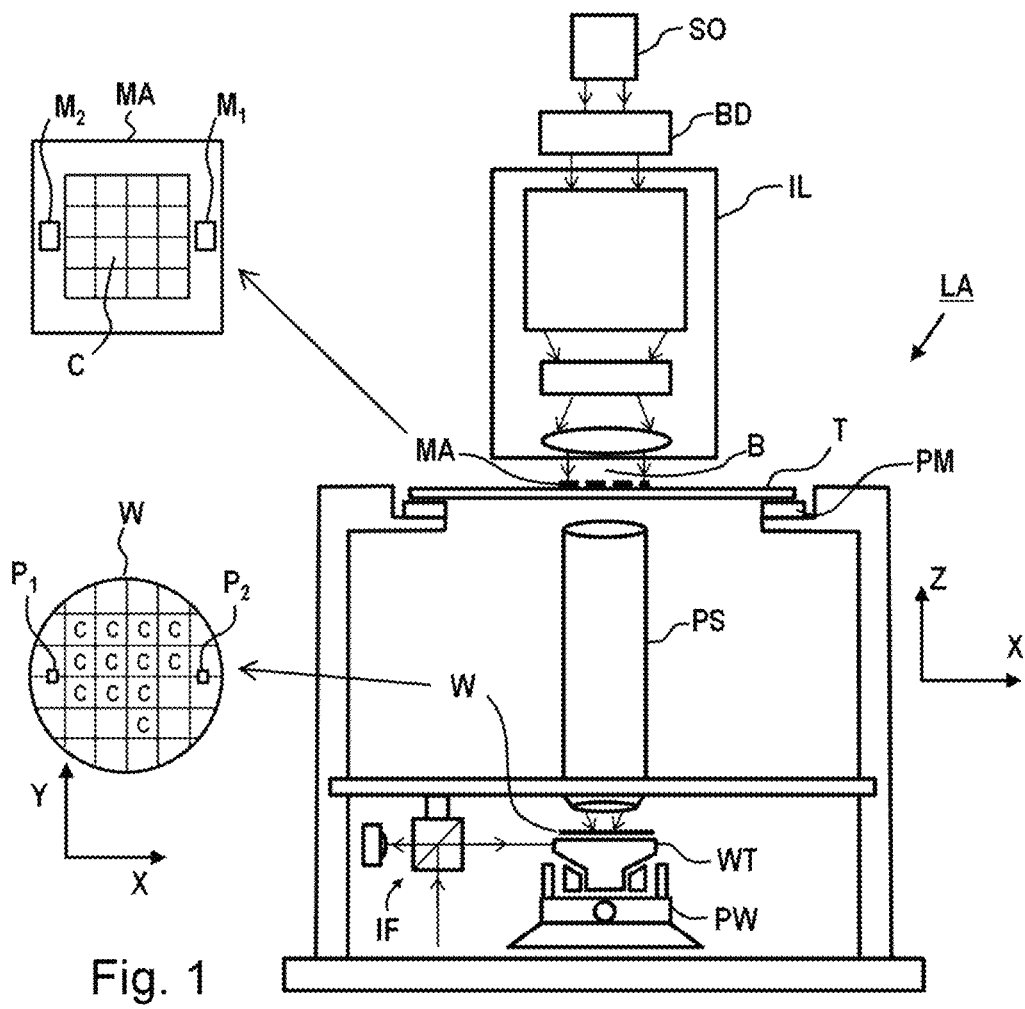
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
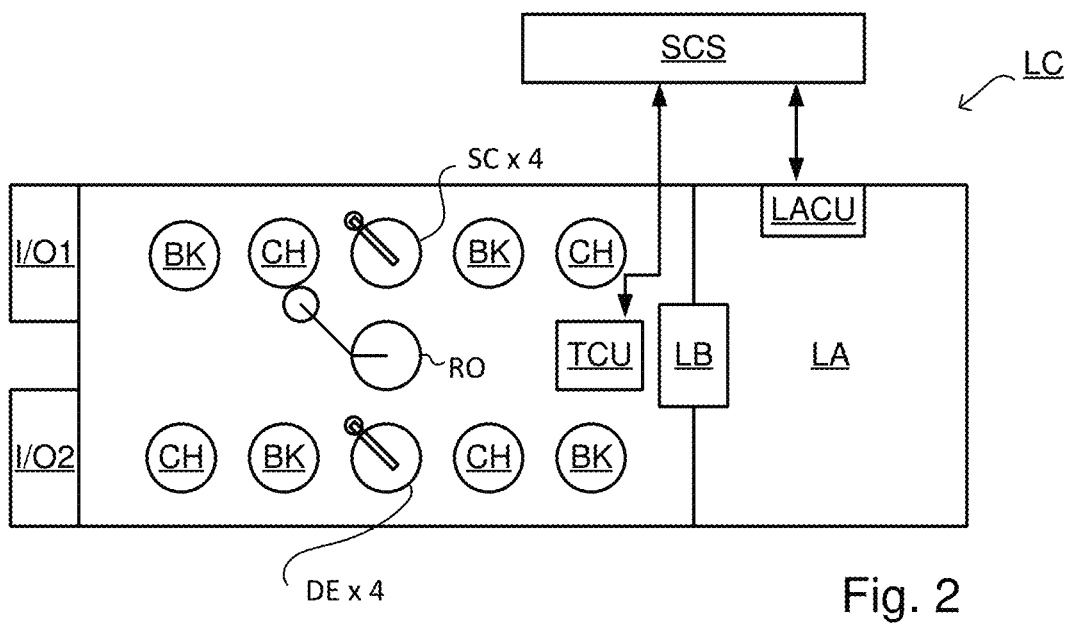
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
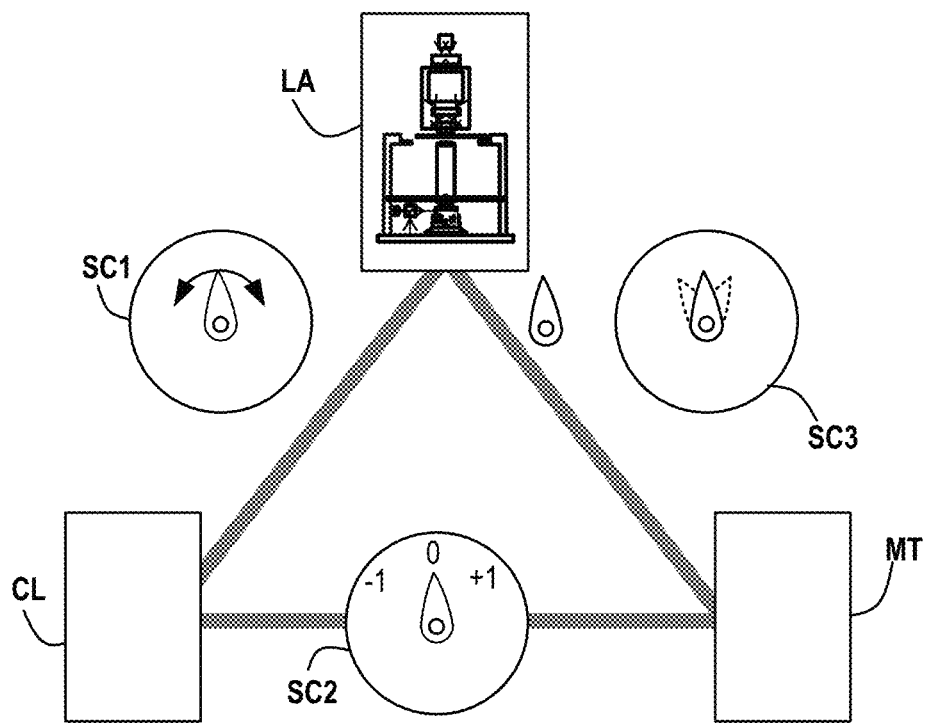
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MT (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MT) to predict whether defects may be present due to e.g. sub-optimal processing (depicted in FIG. 3 by the arrow pointing "0" in the second scale SC2).

The metrology tool MT may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Tools to make such measurement are typically called metrology tools MT. Different types of metrology tools MT for making such measurements are known, including scanning electron microscopes or various forms of scatterometer metrology tools MT. Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,164A, incorporated herein by reference in their entirety. Aforementioned scatterometers may measure gratings using light from soft x-ray and visible to near-IR wavelength range.

In a first embodiment, the scatterometer MT is an angular resolved scatterometer. In such a scatterometer reconstruction methods may be applied to the measured signal to reconstruct or calculate properties of the grating. Such reconstruction may, for example, result from simulating interaction of scattered radiation with a mathematical model of the target structure and comparing the simulation results with those of a measurement. Parameters of the mathematical model are adjusted until the simulated interaction produces a diffraction pattern similar to that observed from the real target.

In a second embodiment, the scatterometer MT is a spectroscopic scatterometer MT. In such spectroscopic scatterometer MT, the radiation emitted by a radiation source is directed onto the target and the reflected or scattered radiation from the target is directed to a spectrometer detector, which measures a spectrum (i.e. a measurement of intensity as a function of wavelength) of the specular reflected radiation. From this data, the structure or profile of the target giving rise to the detected spectrum may be reconstructed, e.g. by Rigorous Coupled Wave Analysis and non-linear regression or by comparison with a library of simulated spectra.

In a third embodiment, the scatterometer MT is a ellipsometric scatterometer. The ellipsometric scatterometer allows for determining parameters of a lithographic process by measuring scattered radiation for each polarization states. Such metrology apparatus emits polarized light (such as linear, circular, or elliptic) by using, for example, appropriate polarization filters in the illumination section of the metrology apparatus. A source suitable for the metrology apparatus may provide polarized radiation as well. Various embodiments of existing ellipsometric scatterometers are described in U.S. patent application Ser. Nos. 11/451,599, 11/708,678, 12/256,780, 12/486,449, 12/920,968, 12/922,587, 13/000,229, 13/033,135, 13/533,110 and 13/891,410 incorporated herein by reference in their entirety.

Figure 4:
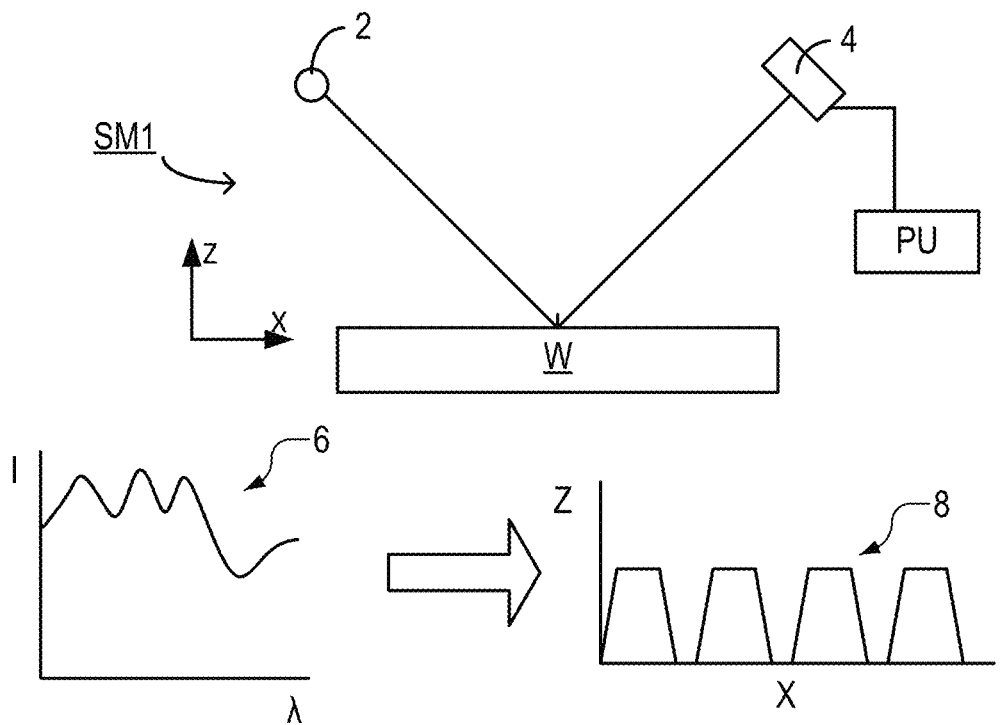
FIG. 4 depicts a schematic overview of a scatterometry apparatus used as a metrology device, which may comprise a radiation source according to embodiments of the invention.

A metrology apparatus, such as a scatterometer, is depicted in FIG. 4. It comprises a broadband (white light) radiation projector 2 which projects radiation onto a substrate W. The reflected or scattered radiation is passed to a spectrometer detector 4, which measures a spectrum 6 (i.e. a measurement of intensity as a function of wavelength) of the specular reflected radiation. From this data, the structure or profile 8 giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Overall measurement quality of a lithographic parameter via measurement of a metrology target is at least partially determined by the measurement recipe used to measure this lithographic parameter. The term "substrate measurement recipe" may include one or more parameters of the measurement itself, one or more parameters of the one or more patterns measured, or both. For example, if the measurement used in a substrate measurement recipe is a diffraction-based optical measurement, one or more of the parameters of the measurement may include the wavelength of the radiation, the polarization of the radiation, the incident angle of radiation relative to the substrate, the orientation of radiation relative to a pattern on the substrate, etc. One of the criteria to select a measurement recipe may, for example, be a sensitivity of one of the measurement parameters to processing variations. More examples are described in US patent application US2016-0161863 and published US patent application US 2016/0370717A1 incorporated herein by reference in its entirety.

Another type of metrology tool used in IC manufacture is a topography measurement system, level sensor or height sensor. Such a tool may be integrated in the lithographic apparatus, for measuring a topography of a top surface of a substrate (or wafer). A map of the topography of the substrate, also referred to as height map, may be generated from these measurements indicating a height of the substrate as a function of the position on the substrate. This height map may subsequently be used to correct the position of the substrate during transfer of the pattern on the substrate, in order to provide an aerial image of the patterning device in a properly focus position on the substrate. It will be understood that "height" in this context refers to a dimension broadly out of the plane to the substrate (also referred to as Z-axis). Typically, the level or height sensor performs measurements at a fixed location (relative to its own optical system) and a relative movement between the substrate and the optical system of the level or height sensor results in height measurements at locations across the substrate.

Figure 5:
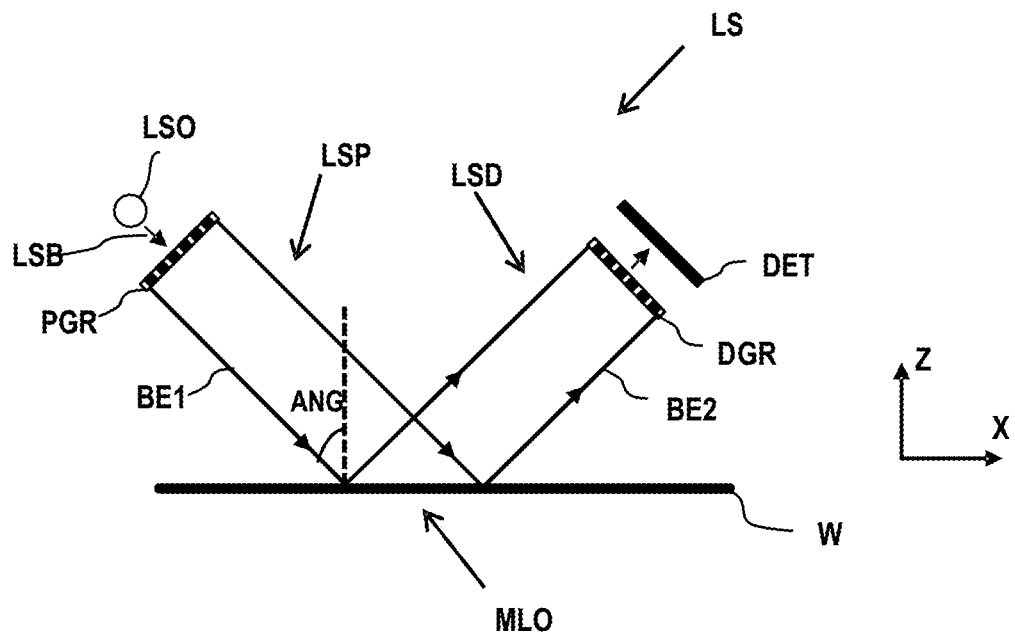
FIG. 5 depicts a schematic overview of a level sensor apparatus which may comprise a radiation source according to embodiments of the invention.

An example of a level or height sensor LS as known in the art is schematically shown in FIG. 5, which illustrates only the principles of operation. In this example, the level sensor comprises an optical system, which includes a projection unit LSP and a detection unit LSD. The projection unit LSP comprises a radiation source LSO providing a beam of radiation LSB which is imparted by a projection grating PGR of the projection unit LSP. The radiation source LSO may be, for example, a narrowband or broadband radiation source, such as a supercontinuum light source, polarized or non-polarized, pulsed or continuous, such as a polarized or non-polarized laser beam. The radiation source LSO may include a plurality of radiation sources having different colors, or wavelength ranges, such as a plurality of LEDs. The radiation source LSO of the level sensor LS is not restricted to visible radiation, but may additionally or alternatively encompass UV and/or IR radiation and any range of wavelengths suitable to reflect from a surface of a substrate.

The projection grating PGR is a periodic grating comprising a periodic structure resulting in a beam of radiation BE1 having a periodically varying intensity. The beam of radiation BE1 with the periodically varying intensity is directed towards a measurement location MLO on a substrate W having an angle of incidence ANG with respect to an axis perpendicular (Z-axis) to the incident substrate surface between 0 degrees and 90 degrees, typically between 70 degrees and 80 degrees. At the measurement location MLO, the patterned beam of radiation BE1 is reflected by the substrate W (indicated by arrows BE2) and directed towards the detection unit LSD.

In order to determine the height level at the measurement location MLO, the level sensor further comprises a detection system comprising a detection grating DGR, a detector DET and a processing unit (not shown) for processing an output signal of the detector DET. The detection grating DGR may be identical to the projection grating PGR. The detector DET produces a detector output signal indicative of the light received, for example indicative of the intensity of the light received, such as a photodetector, or representative of a spatial distribution of the intensity received, such as a camera. The detector DET may comprise any combination of one or more detector types.

By means of triangulation techniques, the height level at the measurement location MLO can be determined. The detected height level is typically related to the signal strength as measured by the detector DET, the signal strength having a periodicity that depends, amongst others, on the design of the projection grating PGR and the (oblique) angle of incidence ANG.

The projection unit LSP and/or the detection unit LSD may include further optical elements, such as lenses and/or mirrors, along the path of the patterned beam of radiation between the projection grating PGR and the detection grating DGR (not shown).

In an embodiment, the detection grating DGR may be omitted, and the detector DET may be placed at the position where the detection grating DGR is located. Such a configuration provides a more direct detection of the image of the projection grating PGR.

In order to cover the surface of the substrate W effectively, a level sensor LS may be configured to project an array of measurement beams BE1 onto the surface of the substrate W, thereby generating an array of measurement areas MLO or spots covering a larger measurement range.

Various height sensors of a general type are disclosed for example in U.S. Pat. Nos. 7,265,364 and 7,646,471, both incorporated by reference. A height sensor using UV radiation instead of visible or infrared radiation is disclosed in US2010233600A1, incorporated by reference. In WO2016102127A1, incorporated by reference, a compact height sensor is described which uses a multi-element detector to detect and recognize the position of a grating image, without needing a detection grating.

Another type of metrology tool used in IC manufacture is an alignment sensor. A critical aspect of performance of the lithographic apparatus is therefore the ability to place the applied pattern correctly and accurately in relation to features laid down in previous layers (by the same apparatus or a different lithographic apparatus). For this purpose, the substrate is provided with one or more sets of marks or targets. Each mark is a structure whose position can be measured at a later time using a position sensor, typically an optical position sensor. The position sensor may be referred to as "alignment sensor" and marks may be referred to as "alignment marks".

A lithographic apparatus may include one or more (e.g. a plurality of) alignment sensors by which positions of alignment marks provided on a substrate can be measured accurately. Alignment (or position) sensors may use optical phenomena such as diffraction and interference to obtain position information from alignment marks formed on the substrate. An example of an alignment sensor used in current lithographic apparatus is based on a self-referencing interferometer as described in U.S. Pat. No. 6,961,116. Various enhancements and modifications of the position sensor have been developed, for example as disclosed in US2015261097A1. The contents of all of these publications are incorporated herein by reference.

Figure 6:
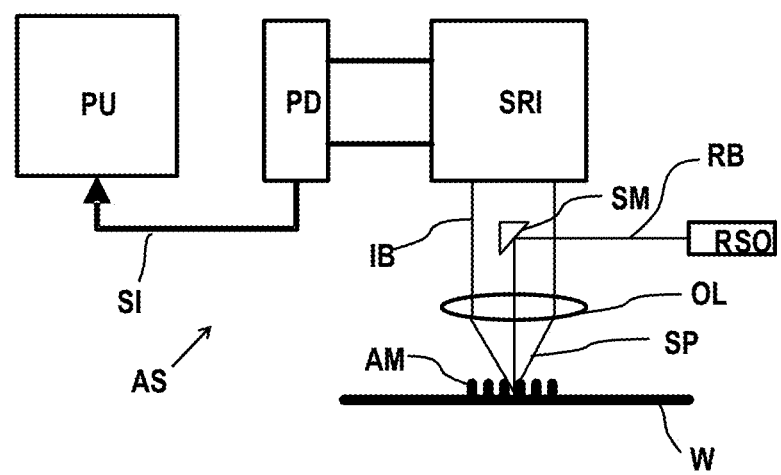
FIG. 6 depicts a schematic overview of an alignment sensor apparatus which may comprise a radiation source according to embodiments of the invention.

FIG. 6 is a schematic block diagram of an embodiment of a known alignment sensor AS, such as is described, for example, in U.S. Pat. No. 6,961,116, and which is incorporated by reference. Radiation source RSO provides a beam RB of radiation of one or more wavelengths, which is diverted by diverting optics onto a mark, such as mark AM located on substrate W, as an illumination spot SP. In this example the diverting optics comprises a spot mirror SM and an objective lens OL. The illumination spot SP, by which the mark AM is illuminated, may be slightly smaller in diameter than the width of the mark itself.

Radiation diffracted by the mark AM is collimated (in this example via the objective lens OL) into an information-carrying beam IB. The term "diffracted" is intended to include zero-order diffraction from the mark (which may be referred to as reflection). A self-referencing interferometer SRI, e.g. of the type disclosed in U.S. Pat. No. 6,961,116 mentioned above, interferes the beam D3 with itself after which the beam is received by a photodetector PD. Additional optics (not shown) may be included to provide separate beams in case more than one wavelength is created by the radiation source RSO. The photodetector may be a single element, or it may comprise a number of pixels, if desired. The photodetector may comprise a sensor array.

The diverting optics, which in this example comprises the spot mirror SM, may also serve to block zero order radiation reflected from the mark, so that the information-carrying beam D3 comprises only higher order diffracted radiation from the mark AM (this is not essential to the measurement, but improves signal to noise ratios).

Intensity signals SI are supplied to a processing unit PU. By a combination of optical processing in the block SRI and computational processing in the unit PU, values for X- and Y-position on the substrate relative to a reference frame are output.

A single measurement of the type illustrated only fixes the position of the mark within a certain range corresponding to one pitch of the mark. Coarser measurement techniques are used in conjunction with this to identify which period of a sine wave is the one containing the marked position. The same process at coarser and/or finer levels may be repeated at different wavelengths for increased accuracy and/or for robust detection of the mark irrespective of the materials from which the mark is made, and materials on and/or below which the mark is provided. The wavelengths may be multiplexed and de-multiplexed optically so as to be processed simultaneously, and/or they may be multiplexed by time division or frequency division.

In this example, the alignment sensor and spot SP remain stationary, while it is the substrate W that moves. The alignment sensor can thus be mounted rigidly and accurately to a reference frame, while effectively scanning the mark AM in a direction opposite to the direction of movement of substrate W. The substrate W is controlled in this movement by its mounting on a substrate support and a substrate positioning system controlling the movement of the substrate support. A substrate support position sensor (e.g. an interferometer) measures the position of the substrate support (not shown). In an embodiment, one or more (alignment) marks are provided on the substrate support. A measurement of the position of the marks provided on the substrate support allows the position of the substrate support as determined by the position sensor to be calibrated (e.g. relative to a frame to which the alignment system is connected). A measurement of the position of the alignment marks provided on the substrate allows the position of the substrate relative to the substrate support to be determined.

For optical semiconductor metrology, inspection applications, such as in any of the aforementioned metrology tools, a bright light source which outputs coherent radiation, simultaneously covering a broad wavelength range (e.g., from UV to IR), is often preferred. Such a broadband light source can help improve the flexibility and robustness of applications by allowing wafers with different material characteristics to be optically examined in the same setup/system without a need for any hardware change (e.g., changing a light source so as to have a specific wavelength). Allowing the wavelength to be optimized for a specific application also means that the accuracy of measurements can be further increased.

Gas lasers, which are based on the gas-discharge effect to simultaneously emit multiple wavelengths, can be used in these applications. However, intrinsic issues such as high intensity instability and low spatial incoherence associated with gas lasers can make them unsuitable. Alternatively, outputs from multiple lasers (e.g., solid-state lasers) with different wavelengths can be spatially combined into the optical path of a metrology or inspection system so as to provide a multiple wavelength source. The complexity and high implementation costs, which increases with the number of wavelengths desired, prevents such a solution from being widely used. In contrast, a fiber-based broadband or white light laser, also called supercontinuum laser, is able to emit radiation with high spatial coherence and broad spectral coverage, e.g., from UV to IR, and therefore is a very attractive and practical option.

A hollow-core photonic crystal fiber (HC-PCF) is a special type of optical fiber that comprises a central hollow core region and an inner cladding structure surrounding the hollow core, both of which extend axially along the entire fiber. The light guidance mechanism is enabled the inner cladding waveguide structure, which may comprise, for example, thin-walled glass elements. The radiation is thus confined predominantly inside a hollow core and propagates along the fiber in the form of transverse core modes.

A number of types of HC-PCFs can be engineered, each based on a different physical guidance mechanism Two such HC-PCFs include: hollow-core photonic bandgap fibers (HC-PBFs) and hollow-core anti-resonant reflecting fibers (HC-ARFs).

Detail on the designing and manufacturing of HC-PCFs can be found in European patent application EP3136143A1, which is incorporated herein by reference. HC-PBFs are configured to offer low loss but narrow bandwidth light guidance via a photonic bandgap effect established by the cladding structure surrounding the central hollow core. Whereas, HC-ARFs are engineered to significantly broaden the transmission bandwidth via anti-resonant reflection of light from the cladding. HC-PCFs comprise hollow channels which are filled with a fluid, such that they possess resultant desired characteristics for various light guiding applications; for example, high-power beam delivery using HC-PBFs and gas-based white light generation (or supercontinuum generation) using HC-ARFs.

For gas-based white light generation, a HC-ARF is comprised within a gas cell, which is designed to operate, for example, at a pressure up to many 100s of bars (e.g., between 3-1000 bar). The gas-filled HC-ARF can act as an optical frequency converter when being pumped by an ultrashort pump laser pulse with sufficient peak power. The frequency conversion from ultrashort pump laser pulses to broadband laser pulses is enabled by a complicated interplay of the dispersion and nonlinear optical processes inside the gas-filled fiber. The filling gas can be a noble gas such as Argon and Krypton, a Raman active gas such as Hydrogen and Nitrogen, or a gas mixture. Depending on the type of filling gas, the nonlinear optical processes can include modulational instability, soliton fission, Kerr effect, Raman effects and dispersive wave generation, details of which are described in WO2018/127266A1 and U.S. Pat. No. 9,160,137B1 (both of which are hereby incorporated by reference). Since the dispersion of the filling gas can be tuned by varying the gas cell pressure, the generated broadband pulse dynamics and the associated spectral broadening characteristics can be adjusted so as to optimize the frequency conversion. The generated broadband laser output can cover wavelengths from UV (e.g., <200 nm) to mid-IR (e.g., >2000 nm).

As illustrated in FIG. 7, an optical component 100, 100', 100" comprises a HC-PCF (e.g., a HC-ARF) 101 having a specific fiber length and a gas cell 102 filled with a working gas or a gas mixture at a specific pressure or with a pressure distribution. The gas cell 102 further comprises an input optical window 103a and an output optical window 103b, located at respective ends of the gas cell 102. The input optical window 103a is operable to admit ultrashort pump laser pulses into the gas cell 102 via the window. After being coupled into the gas-filled HC-PCF 101, pump laser pulses (not shown) propagate along the fiber where they experience significant spectral broadening. Resultant broadband laser pulses are subsequently discharged from the gas cell 102 via the output window 103b.

To fill the HC-PCF 101 with a working gas, the gas cell 102 should be in communication with a pressurized gas supply or reservoir (not shown). The inner surfaces of the walls and windows 103a, 103b of the gas cell 102 enclose a cavity with a volume V. The axis of the gas cell is parallel to the axis of the HC-PCF 101

Figure 7A:
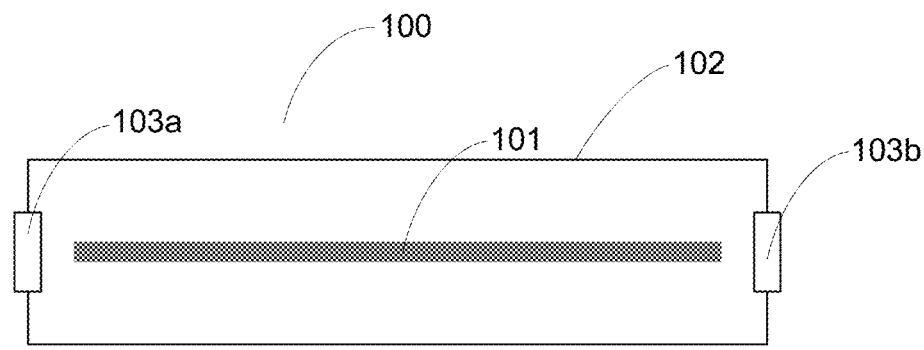
FIGS. 7(a)-7(c) schematically depicts examples of prior art optical components in three different configurations.
Figure 7B:
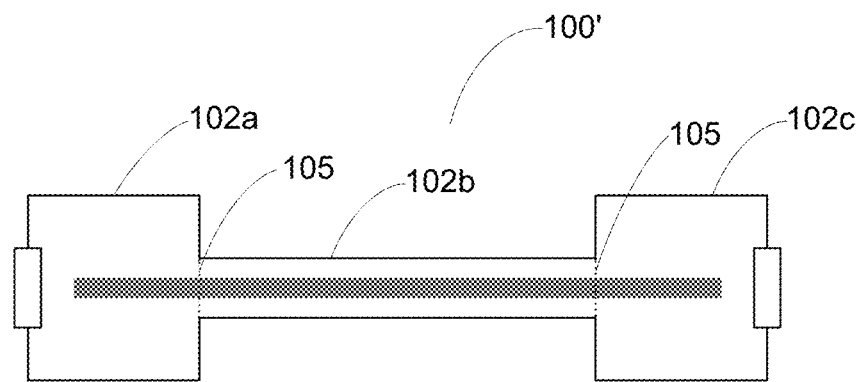
Figure 7C:
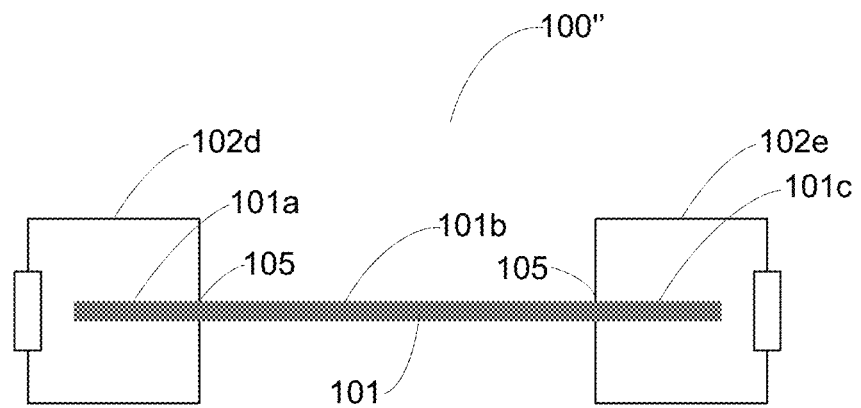

FIGS. 7(a)-(c) schematically depicts three known configurations of the optical component 100, 100', 100". FIG. 7(a) illustrates a first configuration where the entire HC-PCF 101 is comprised within a single gas cell 102. FIG. 7(b) illustrates an alternative arrangement where the entire HC-PCF 101 is comprised in several (e.g., three) sub-cells 102a, 102b, 102c which are interconnected by using appropriate an sealing mechanism 105. The pressure-tight connections ensure all the sub-cells to reach the same pressure desired for white light generation. FIG. 7(c) illustrates another configuration where the two fiber ends 101a, 101c of the HC-PCF (101) are comprised in two separate gas cells 102a,102c respectively, while a central portion (101b) of the fiber, acting as a fluid connection, is comprised outside of the gas cells.

The gas cells of the prior art all have a relatively large internal local cavity volume $V_{loc}$, which is defined as a cavity volume per unit fiber length; for example, expressed in the unit of $cm^3$ per cm fiber. It has been found that the performance of a white light laser can be degraded by the presence of contaminating particles, which are generally proportional to the size of the local cavity volume. The larger the local cavity volume $V_{loc}$ of a gas cell is, the more gas atoms or molecules are required to reach a specific pressure, and correspondingly the more contaminating particles would be present in the gas cell. Under the influence of high intensity light, the contaminating particles may react or interact with the material of the HC-PCF and thereby locally modify the structure of the HC-PCF. The more contaminating particles are present in the gas cell, the more or larger the local change may be. It is for example seen that contamination can accumulate close to the light input or light output window of the HC-PCF. The accumulation of contamination can be reduced by ensuring that the amount of contaminating particles is small within the gas cell as a whole. It is also to be noted that the gas may circulate through the gas cell under the influence of temperature different and/or diffuse in and out of the HC-PCF. Furthermore, a gas cell is a pressurized container and imposes substantial requirements on safety. The potential for hazard of such a gas cell increases with the size of the local cavity volume $V_{loc}$.

Therefore, to address these issues, an optical component is proposed which has a suitably dimensioned local cavity volume $V_{loc}$. By minimizing the local cavity volume $V_{loc}$ of a gas cell of an optical component, it is possible to simultaneously improve the optical performance and relax operating safety requirements for a HC-PCF based broadband laser.

Figure 8A:
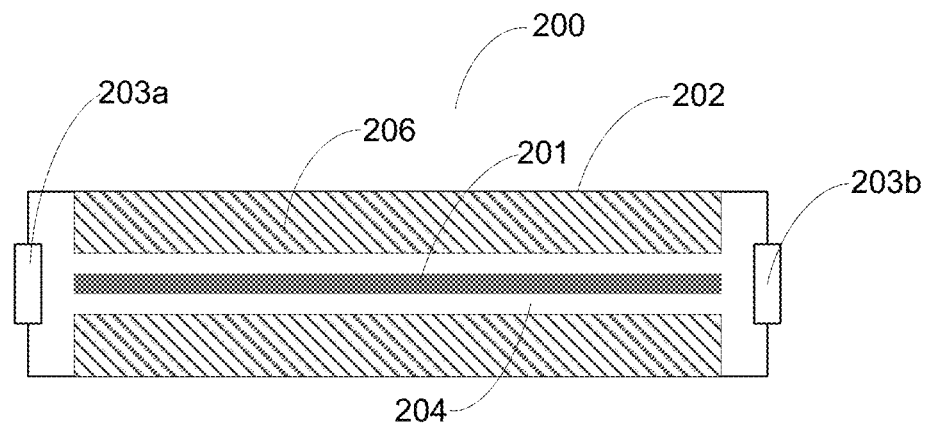
FIGS. 8(a)-8(c) schematically depicts optical components in three different configurations according to three embodiments of the invention.

FIG. 8(a) illustrates a first such optical component 200, comprising only a single gas cell 202. In order to lower the local cavity volume $V_{loc}$, the gas cell is designed such that the spacing between the outer surface of the HC-PCF 201 and the inner surface of the gas cell wall 206 is reduced to a preferable range, e.g., 0-3 cm. This spacing can be made sufficiently small in a number of ways. For example, the gas cell may comprise thick walls. Alternatively, or in addition, an inner sleeve or cylinder may be introduced within the volume to effectively thicken the walls and ensure a smaller gas volume. Any arrangement to arrive at the claimed local cavity volume can be used. In addition, the feature of thickening the cell walls and/or introducing an inner sleeve to achieve this can be done independently of arriving at the claimed local cavity volume (e.g., 36 $cm^3$ or smaller)

The cavity volume V of the gas cell 202 comprises a central cavity volume defined by the gas cell 202 along the length of the HC-PCF 201, (e.g., the cross-sectional area A of the central cavity multiplied by the length L of the HC-PCF 201), and two end cavity volumes $V_{end}$, each defined by the gas cell volume between an end of the HC-PCF 201 and a respective inner surface of the output window 203a, 203b. The length L of the HC-PCF 201 may lie, for example, in the range 0-1000 cm. The cavity volume (204) can be calculated by:

$$V = V_{cen} + 2V_{end},\qquad \text{[Equation 1]}$$

$$\text{where } V_{cen} = A \times L. \qquad \text{[Equation 2]}$$

The local cavity volume $V_{loc}$, at least along the length L of the HC-PCF 201, can then be obtained by:

$$V_{loc} = V_{cen}/L. \qquad \text{[Equation 3]}$$

$$\approx V/L (\text{assuming that } V_{end} \ll V_{cen})$$

It is proposed that this local cavity volume along the length of HC-PCF 201 is at least below 36 $cm^3$ per cm fiber (i.e., HC-PCF) length. In other embodiments, the local cavity volume may be below 32 $cm^3$ per cm fiber length, below 28 $cm^3$ per cm fiber length, below 24 $cm^3$ per cm fiber length, below 20 $cm^3$ per cm fiber length, below 16 $cm^3$ per cm fiber length, below 12 $cm^3$ per cm fiber length, below 8 $cm^3$ per cm fiber length or below 4 $cm^3$ per cm fiber length. The local cavity volume is defined for at least 70%, 80%, 90%, 95% or 98% of the length of the hollow-core photonic crystal fiber which is enclosed within the gas cell (i.e., the volume is so limited to these values for at least these proportions of the fiber length).

Figure 8B:
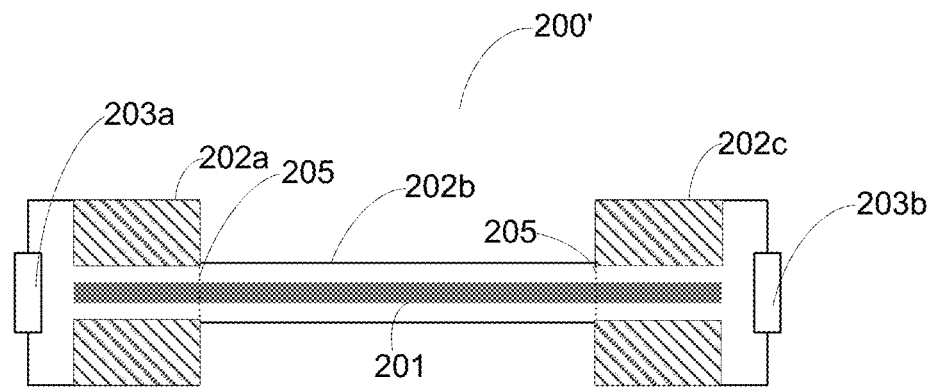

FIG. 8(b) shows a second embodiment of the invention. In this embodiment, the optical component is comprised of multiple sub-cells, more specifically three sub-cells 202a, 202b, 202c. The HC-PCF (201) is comprised in several sub-cells, including two end sub-cells 202a, 202c with a larger external cross-section with respect to a central sub-cell 202b. The central sub-cell 202b can be rigid or flexible. For example, the central sub-cell 202b can comprise a conventional pressure pipe made from a certain material (e.g., stainless steel) or a mixture of different materials (e.g., metal alloys or plastics). The two end sub-cells 202a and 202c can have the same external transverse dimensions as those of the single gas cell 202 of FIG. 8(a). Whatever the external dimensions, the internal dimensions, at least along the length L of the HC-PCF 201, will be such that the local cavity volume along length L is below 36 cm$^3$ per cm fiber, and may comprise any of the values described above in relation to FIG. 8(a).

Figure 8C:
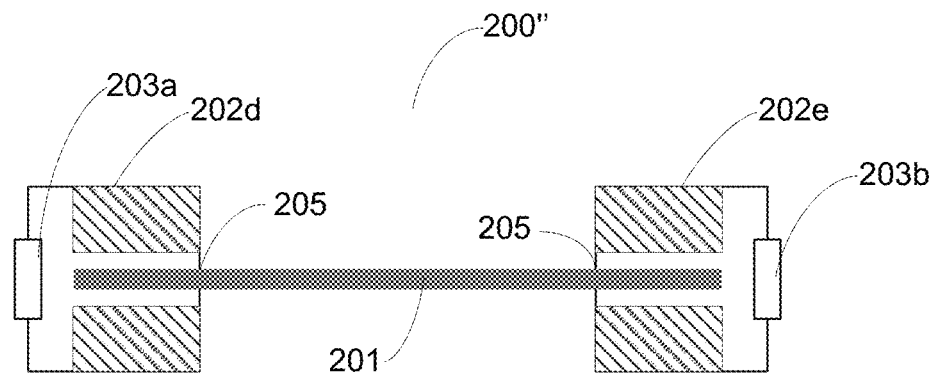

The second embodiment 200' described above can be further simplified by removing the central sub-cell 202b to correspond with an arrangement similar to that illustrated in FIG. 7(c). FIG. 8(c) illustrates such an optical component 200", the two end sub-cells 202d, 202e may have the same external and internal dimensions as those illustrated in FIG. 7(b). The two end portions of HC-PCF 201 are housed in respective ones of these two end sub-cells 202d, 202e while a central portion of the HC-PCF 201 is not enclosed in a sub-cell. Appropriate sealing mechanisms 205 are applied to the gaps formed between the outer surface of the fiber and surfaces of the gas cell walls such that both sub-cells are pressure-tight and can be pressurized to a desired pressure. As before, the housed section of the fiber length (e.g., for the length corresponding to sub-cells 202d, 202e have a maximum local cavity volume of 36 cm$^3$ per cm fiber, and optionally any of the values described above in relation to FIG. 8(a).

Figure 9:
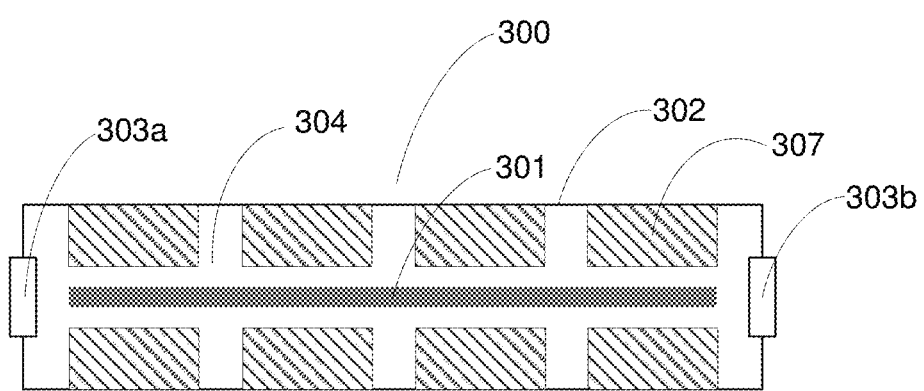
FIG. 9 schematically depicts a method for lowering the volume of the gas cell cavity in a post-processing step according to an embodiment of the invention.

Depending on the configuration of the optical component 200, the cross-section of the cavity, having a certain shape and an area, may be constant along the fiber length, as in the case of the first configuration. Alternatively, the cross-section of the cavity may be location-dependent (or sub-cell dependent), as in the case of the second configuration. The shape of the cross-section can be a rectangle, a rounded rectangle, an ellipse or a circle As mentioned above, the local cavity volume can be lowered by reducing the spacing between the outer surface of the HC-PCF 201 and the inner surface of the gas cell wall 206. The reduction of the spacing can be achieved through several approaches, for example: 1) reducing the transverse dimensions of the gas cell; 2) maintaining the existing transverse external dimensions of the gas cell but increasing the wall thickness within the gas cell; 3) maintaining the existing transverse dimensions of the gas cell and inserting filling elements within the cell cavity. Since the gas cells are typically manufactured before incorporating the HC-PCF 301, it is possible to use larger volume gas cells (i.e., having a local cavity volume greater than 36 cm$^3$ per cm fiber) and performing post-processing step thereon which lowers the local cavity volume. Such an optical component 300 is illustrated in FIG. 9. In an embodiment, the post-processing step comprises the insertion of filling elements 307 into the gas cell cavity 304. The filling elements can be solid blocks made from metal or other another material. Taking into account the gaps between the filing elements 307, the filing elements 307 should extend along most of the length of HC-PCF 301, e.g., along at least 70%, 80%, 90%, 95% or 98% of the length of HC-PCF 301. The basic principle of using filing elements 307 is also applicable for the embodiments of FIGS. 8(b) and 8(c), i.e., for the sub-cells 202a, 202c 202d, 202e; e.g., to extend along most (e.g., at least 70%, 80%, 90%, 95%, or 98%) of the length of a respective portion of HC-PCF 301 comprised within that cell.

The cross-section of any of the gas cells (or sub-cells) disclosed herein may have any suitable shape, for example an (e.g., rounded) rectangle, an ellipse or a circle.

The HC-PCF 301 as described herein may comprise any suitable fiber device such as, for example: a hollow-core anti-resonant reflecting fiber, a inhibited coupling hollow-core photonic crystal fiber, a hollow core revolver fiber and a nested anti-resonant reflecting fiber.

A broadband light source device, e.g., being able to emit white light or broadband pulses, may comprise an optical component as disclosed herein and a pump laser operable to produce ultrashort pump laser pulses. The pump laser pulses, generated by a pump laser device, can be nanosecond pulses, picosecond pulses or femtosecond pulses, and the pump wavelength can be in visible regime, near-IR regime or mid-IR regime. The pump laser pulses can have a repetition frequency of several-hundred hertz (Hz), kilohertz (kHz), or megahertz (MHz).

A broadband light source device comprising any of the optical components disclosed herein can be configured to output a broadband coherent radiation comprising, for example a wavelength range between 200 nm to 2000 nm, or any sub-range within this range.

Potentially, by making the gas cell volume very small, this may enforce a laminar gas flow, which likely increases stability of the light source.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Although specific reference may have been made above to the use of embodiments of the invention in the context of optical lithography, it will be appreciated that the invention, where the context allows, is not limited to optical lithography and may be used in other applications, for example imprint lithography.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the clauses set out below.

1. An optical component, being configured to function as an optical frequency converter in a broadband radiation source device, comprising:
a gas cell; and
a hollow-core photonic crystal fiber at least partially enclosed within the gas cell, and
wherein a local cavity volume of the gas cell comprises a maximum value of 36 cm$^3$ per cm of length of the hollow-core photonic crystal fiber.

2. The optical component of clause 1, wherein the hollow-core photonic crystal fiber is wholly enclosed within the gas cell.

3. The optical component of clause 1, wherein the gas cell comprises a plurality of sub-cells, the plurality of sub-cells comprising at least two end sub-cells, enclosing respective ends of the hollow-core photonic crystal fiber.

4. The optical component of clause 3, wherein the sub-cells extend along the full length of the hollow-core photonic crystal fiber and further comprise at least one central sub-cell.

5. The optical component of clause 4, wherein an external cross-section diameter of the central sub-cell is smaller than an external cross-section diameter of the two end sub-cells.

6. The optical component of clause 4, wherein the central sub-cell comprises a pressure pipe.

7. The optical component of clause 1, wherein a maximum value of the local cavity volume is one of: 32 cm$^3$ per cm of length of the hollow-core photonic crystal fiber, 28 cm$^3$ per cm of length of the hollow-core photonic crystal fiber, 24 cm$^3$ per cm of length of the hollow-core photonic crystal fiber, 20 cm$^3$ per cm of length of the hollow-core photonic crystal fiber, 16 cm$^3$ per cm of length of the hollow-core photonic crystal fiber, 12 cm$^3$ per cm of length of the hollow-core photonic crystal fiber, 8 cm$^3$ per cm of length of the hollow-core photonic crystal fiber, or 4 cm$^3$ per cm of length of the hollow-core photonic crystal fiber.

8. The optical component of clause 1, wherein a gas cell comprises filling elements to reduce a local cavity volume of the optical component.

9. The optical component of clause 1, wherein the hollow-core photonic crystal fiber comprises one or more of: a hollow-core anti-resonant reflecting fiber, an inhibited coupling hollow-core photonic crystal fiber, a hollow core revolver fiber, and a nested anti-resonant reflecting fiber.

10. The optical component of clause 1, comprising an input optical window for admitting a pump laser pulse and an output optical window for outputting the broadband radiation, wherein the input optical window and output optical window are located at respective ends of the gas cell.

11. The optical component of clause 1, wherein the local cavity volume is defined for at least 70%, 80%, 90%, 95% or 98% of the length of the hollow-core photonic crystal fiber that is enclosed within the gas cell.

12. A broadband light source device comprising an optical component of clause 16, and being configured for creating broadband radiation.

13. The broadband light source device of clause 12, further comprising a pump laser being operable to generate ultrashort pump laser pulses, the optical component being operable to convert the ultrashort pump laser pulses into the broadband radiation.

14. A metrology device comprising a broadband light source device of clause 13.

15. The metrology device of clause 14, comprising a scatterometer metrology apparatus, a level sensor or an alignment sensor.

The invention claimed is:

1. An optical component configured to function as an optical frequency converter in a broadband radiation source device, the optical component comprising:
a gas cell; and
a hollow-core photonic crystal fiber at least partially enclosed within the gas cell,
wherein the gas cell comprises a plurality of sub-cells, the plurality of sub-cells comprising:
two end sub-cells enclosing respective ends of the hollow-core photonic crystal fiber; and
a central sub-cell between the two end sub-cells.

2. The optical component of claim 1, wherein the plurality of sub-cells extend along a portion of the length of the hollow-core photonic crystal fiber within the gas cell.

3. The optical component of claim 1, wherein an external cross-section diameter of the central sub-cell is smaller than an external cross-section diameter of the two end sub-cells.

4. The optical component of claim 1, wherein the central sub-cell is rigid.

5. The optical component of claim 4, wherein the central sub-cell comprises a pressure pipe.

6. The optical component of claim 1, wherein the central sub-cell is flexible.

7. The optical component of claim 6, wherein the central sub-cell comprises plastics, metal alloys, or a combination thereof.

8. The optical component of claim 1, wherein the gas cell comprises a structural integrity for withstanding pressures of approximately 3 to 1000 bar.

9. The optical component of claim 1, wherein the gas cell comprises filling elements configured to reduce a local cavity volume of the optical component.

10. The optical component of claim 9, wherein the filling elements are arranged symmetrically about an optical axis of the hollow-core photonic crystal fiber.

11. The optical component of claim 9, wherein the filling elements are arranged in the two end sub-cells.

12. The optical component of claim 9, wherein the filling elements extend along a circumference of the gas cell.

13. The optical component of claim 9, wherein the filling elements comprise a solid material.

14. The optical component of claim 9, wherein the filling elements extend along a length of the gas cell within the gas cell.

15. The optical component of claim 9, wherein the filling elements comprise a rectangular cross-section, a square cross-section, a rounded rectangular cross-section, a rounded square cross-section, an elliptical cross-section, a circular cross-section, or an annular cross-section.

16. The optical component of claim 1, further comprising:
an input optical window configured to admit a pump laser pulse; and
an output optical window configured to output a broadband radiation,
wherein the input optical window and the output optical window are located at respective opposite ends of the gas cell.

17. A broadband light source device comprising the optical component of claim 1, and being configured for creating broadband radiation.

18. The broadband light source device of claim 17, further comprising a pump laser being operable to generate ultrashort pump laser pulses, the optical component being operable to convert the ultrashort pump laser pulses into the broadband radiation.

19. A metrology device comprising the broadband light source device of claim 18.

20. The metrology device of claim 19, comprising a scatterometer metrology apparatus, a level sensor, or an alignment sensor.

* * * * *

UNITED STATES PATENT AND TRADEMARK OFFICE
CERTIFICATE OF CORRECTION

PATENT NO. : 11,754,906 B2
APPLICATION NO. : 18/093717
DATED : September 12, 2023
INVENTOR(S) : Uebel et al.

It is certified that error appears in the above-identified patent and that said Letters Patent is hereby corrected as shown below:

In the Specification

In Column 9, Line 21, delete "D3" and insert -- IB --, therefor.

In Column 9, Line 31, delete "D3" and insert -- IB --, therefor.

Signed and Sealed this
Seventeenth Day of October, 2023

Katherine Kelly Vidal
*Director of the United States Patent and Trademark Office*